(12) United States Patent
Hui et al.

(10) Patent No.: US 6,727,143 B1
(45) Date of Patent: Apr. 27, 2004

(54) METHOD AND SYSTEM FOR REDUCING CHARGE GAIN AND CHARGE LOSS WHEN USING AN ARC LAYER IN INTERLAYER DIELECTRIC FORMATION

(75) Inventors: Angela T. Hui, Fremont, CA (US); Mark T. Ramsbey, Sunnyvale, CA (US); Yu Sun, Saratoga, CA (US); David H. Matsumoto, Los Altos, CA (US)

(73) Assignees: Advanced Micro Devices, Inc., Sunnyvale, CA (US); Fujitsu Limited, Kanagawa (JP); Fujitsu and Semiconductor Ltd., Fukushima Pref. (JP)

( * ) Notice: Subject to any disclaimer, the term of this patent is extended or adjusted under 35 U.S.C. 154(b) by 0 days.

(21) Appl. No.: 09/533,619

(22) Filed: Mar. 22, 2000

Related U.S. Application Data (60) Provisional application No. 60/168,212, filed on Nov. 30, 1999.

(51) Int. Cl.$^7$ .................................. H01L 21/8242
(52) U.S. Cl. ................... 438/256; 438/399; 438/586; 438/597; 438/638
(58) Field of Search .................. 438/256, 399, 438/586, 597, 638, 299, 618; 257/244, 245, 249, 382, 503, 508, 621, 622, 632

(56) References Cited

U.S. PATENT DOCUMENTS

| | | | | |
|---|---|---|---|---|
| 5,786,276 A | * | 7/1998 | Brooks et al. | 438/724 |
| 6,222,214 B1 | * | 4/2001 | Wuu et al. | 257/296 |
| 6,300,235 B1 | * | 10/2001 | Feldner et al. | 438/618 |
| 6,316,345 B1 | * | 11/2001 | Shields | 438/597 |
| 6,326,301 B1 | * | 12/2001 | Venkatesan et al. | 438/638 |

* cited by examiner

*Primary Examiner*—Long Pham
*Assistant Examiner*—Wai-Sing Louie
(74) *Attorney, Agent, or Firm*—Winstead Sechrest & Minick P.C.

(57) ABSTRACT

A method and system for insulating a lower layer of a semiconductor device from an upper layer of the semiconductor device is disclosed. The method and system include providing an interlayer dielectric on the lower layer. The method and system further include providing an antireflective coating (ARC) layer. At least a portion of the ARC layer is on the interlayer dielectric. The method and system further include providing a plurality of via holes in the interlayer dielectric and the ARC layer and filling the plurality of via holes with a conductive material. The method and system further include removing the ARC layer while reducing subsequent undesirable charge gain and subsequent undesirable charge loss over the use of a chemical mechanical polish in removing the ARC layer.

7 Claims, 7 Drawing Sheets

Prior Art

METHOD AND SYSTEM FOR REDUCING CHARGE GAIN AND CHARGE LOSS WHEN USING AN ARC LAYER IN INTERLAYER DIELECTRIC FORMATION

CROSS-REFERENCE TO RELATED APPLICATION

This Application is related to commonly owned co-pending Provisional Application Ser. No. 60/168,212, filed Nov. 30, 1999 and claims the benefit of its earlier filing date under 35 U.S.C. § 119(e).

FIELD OF THE INVENTION

The present invention relates to semiconductor devices, such as flash memory devices, more particularly to a method and system for removal of the antireflective-coating layer.

BACKGROUND OF THE INVENTION

A conventional semiconductor device, such as a conventional embedded flash memory, includes several layers of components. For example, memory cells in a memory region of the semiconductor device may be in the layer of components on and just above the substrate. Components in subsequent layers should be electrically insulated from components in layers above and below except where electrical connection is specifically desired to be made. The layer that isolates distinct layers is known as the inter-layer dielectric ("ILD"). Electrical connection to lower layers is made using conventional contacts which extend through the ILD. The conventional contacts typically include via plugs which is extend through via holes in the ILD.

Figure 1:
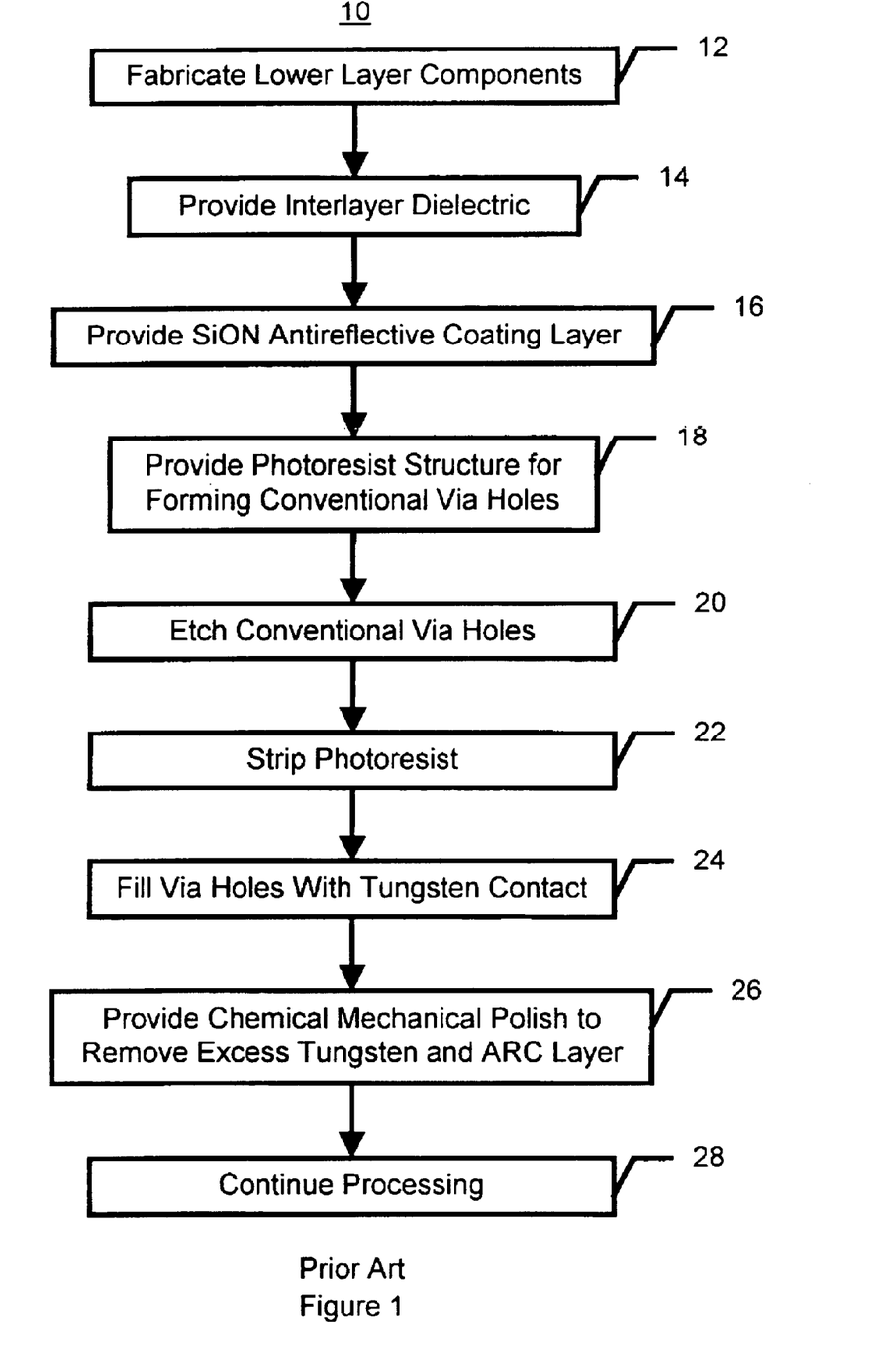
FIG. 1 is a flow chart of a conventional method for providing a portion of semiconductor device

FIG. 1 is a flow chart depicting a conventional method 10 for fabricating a portion of a conventional semiconductor device, such as a conventional embedded flash memory. Components in lower layer are fabricated, via step 12. For the first ILD, the lower layer is the layer just above the substrate. Thus, step 12 could include fabricating the memory cells in the first layer of the semiconductor device. The ILD is then provided on the lower layer to insulate the lower layer from subsequent, via step 14. Typically, step 14 includes providing a layer of borophospho-tetraethylorthosilicate ("BPTEOS") or a layer of borophospho-silicate glass ("BPSG"). Thus, the ILD is typically B or P doped TEOS or a B or P doped silicate glass.

Typically, contact is made to various portions of the lower layer through the ILD. Thus, conventional contacts are fabricated. In order to fabricate a conventional contact, a conventional SiON antireflective coating ("ARC") layer of a desired thickness is deposited, via step 16. The desired thickness is typically approximately two hundred to four hundred Angstroms. The ARC layer helps to reduce reflections from the ILD layer and other underlying layers when providing a photoresist structure, as discussed below. The ARC so layer is used because reflections from underlying layers can cause errors in the photoresist structure provided. In particular, without the ARC layer of the desired thickness, the critical dimension of structures formed using the photoresist structure may vary widely from the desired dimension.

A first photoresist structure is then provided on the conventional ARC layer, via step 18. The first photoresist structure is typically provided by spinning a layer of photoresist onto the ARC layer and using photolithography to develop a pattern, or mask, in the photoresist layer. The photoresist structure includes apertures of the desired size over regions of the ILD in which via holes are desired to be etched.

Once the first photoresist structure has been provided, the conventional via holes are etched in the ILD, via step 20. The resist structure is then stripped, typically using a dry oxygen ashing and wet etch, via step 22. Also in step 22, residues are cleaned. The conventional via holes are filled with a conductive material, forming a conventional via plug, or conventional contact, via step 24. The conventional via plug is typically composed of W. Thus, electrical contact can be made to structures in the lower layer. However, excess W outside of the conventional via holes should be removed to provide discrete contacts. Furthermore, in order to allow cells in the semiconductor device to be erased using ultraviolet ("UV") light, the ARC layer may need to be removed. Thus, the excess W is polished away and the ARC layer is removed using a chemical-mechanical polish ("CMP") step, via step 26. The ARC layer is polished away at the end of the W polishing step, typically using an oxide buff. Processing of the semiconductor device then continues, via step 28. Step 28 typically includes fabricating components for subsequent layers and the ILD layers which separate subsequent layers.

Figure 2A:
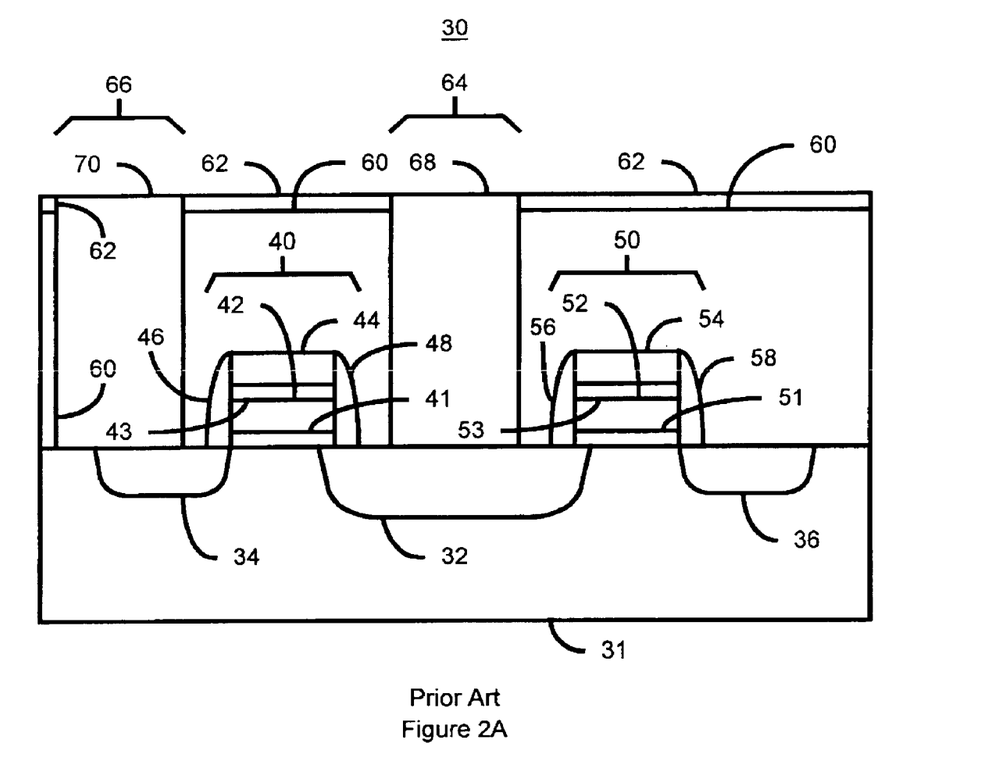
FIG. 2A is a side view of a conventional semiconductor device during fabrication, prior to removal of the antireflective coating layer.

FIG. 2A depicts a portion of a conventional semiconductor device 30 when the first ILD is being formed. In particular, FIG. 2A depicts the conventional semiconductor device after step 20 has been performed for the first ILD. The conventional semiconductor device 30 includes memory cells 40 and 50 share a common drain 32. The ILD 60 and the ARC layer 62 have been deposited. The conventional via holes 64 and 66 have been etched in the ILD 60. Furthermore, the conventional via holes 64 and 66 have been filled with conventional via plugs to form conventional contacts 68 and 70.

Figure 2B:
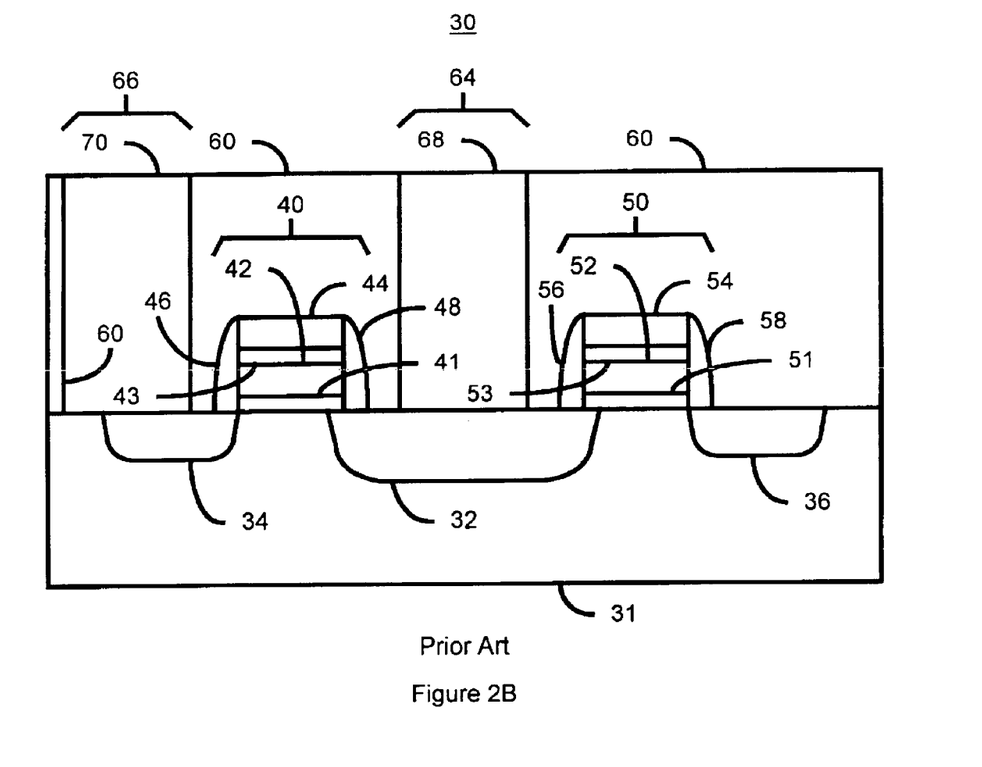
FIG. 2B is a side view of a conventional semiconductor device during fabrication, after removal of the antireflective coating layer.

FIG. 2B depicts the conventional semiconductor device 30 after step 26, removal of the ARC layer 62 through CMP has been completed. A second layer of components can be fabricated on the ILD 60. Because the ARC layer 62 has been removed, the memory cells 40 and 50 can be erased using UV light.

Although the conventional method 10 can be used for fabricating the conventional semiconductor device 30, one of ordinary skill in the art will readily understand that the conventional method 10 results charge gain and charge loss issues. In particular, components in the semiconductor device 30 may unexpectedly gain or lose charge. For example, charge on the conventional contact 68 may travel to the memory cell 40 or 50 when a user does not desire the memory cell 40 or 50 to store charge. Similarly, a charge stored on the floating gate of the memory cell 40 or 50 may travel to the conventional contact 68. Thus, a charge intentionally stored on the floating gate 42 may bleed away. The cell 40 or 50 may be subject to unanticipated charge gain and charge loss. As a result, the cell 40 or 50 may not function as desired.

Accordingly, what is needed is a system and method for providing the semiconductor device in which the unexpected charge gain and charge loss are reduced. The present invention addresses such a need.

SUMMARY OF THE INVENTION

The present invention provides a method and system for insulating a lower layer of a semiconductor device from an upper layer of the semiconductor device. The method and system comprise providing an interlayer dielectric on the lower layer. The method and system further comprise providing an antireflective coating (ARC) layer. At least a portion of the ARC layer is on the interlayer dielectric. The method and system also comprise providing a plurality of via holes in the interlayer dielectric and the ARC layer and filling the plurality of via holes with a conductive material. The method and system further so comprise removing the ARC layer while reducing subsequent undesirable charge gain and subsequent undesirable charge loss over the use of a chemical mechanical polish in removing the ARC layer.

According to the system and method disclosed herein, the present invention removes the ARC layer without use of a chemical mechanical polish. Consequently, the undesired charge gain and charge loss are reduced.

DETAILED DESCRIPTION OF THE INVENTION

The present invention relates to an improvement in semiconductor processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Conventional semiconductor devices have multiple layers. Each layer may have several components. For example, the first layer of a semiconductor memory device typically includes several memory cells. Typically, different layers are electrically insulated by an interlayer dielectric ("ILD"). In order to make electrical contact between certain components in different layers, conventional contacts are provided in the ILD.

In order to form the conventional contacts, an antireflective coating ("ARC") layer is deposited on the ILD. A photoresist pattern is then provided on the ARC layer. Conventional via holes are etched into the ILD and the photoresist pattern removed. The conventional via holes are filled with a conductive material, typically W. Excess W is then removed using a chemical mechanical polish ("CMP") step. In many conventional semiconductor devices, the ARC layer is then removed, typically at the end of the CMP step which removes excess W. For example, the ARC layer removal may be removed to allow ultraviolet ("UV") light to be used in erasing memory cells below the ARC layer. Typically, the ARC layer is also removed using a CMP step at the end of the W polish. Processing of the conventional semiconductor then continues, for example by fabricating the next layer of the semiconductor device.

Although conventional semiconductor devices fabricated as described above may function, one of ordinary skill in the art will readily realize that the conventional semiconductor devices may be subject to unanticipated charge gain and charge loss. Components in the conventional semiconductor device may unexpectedly gain or lose charge. As a result, the components of the conventional semiconductor device may not function as desired.

The present invention provides a method and system for insulating a lower layer of a semiconductor device from an upper layer of the semiconductor device. The method and system comprise providing an interlayer dielectric on the lower layer. The method and system further comprise providing an antireflective coating (ARC) layer. At least a portion of the ARC layer is on the interlayer dielectric. The method and system also comprise providing a plurality of via holes in the interlayer dielectric and the ARC layer and filling the plurality of via holes with a conductive material. The method and system further comprise removing the ARC layer while reducing subsequent undesirable charge gain and subsequent undesirable charge loss over the use of a chemical mechanical polish in removing the ARC layer.

The present invention will be described in terms of a particular device having certain components and particular techniques for performing certain steps. However, one of ordinary skill in the art will readily recognize that this method and system will operate effectively for other devices having other components and other techniques. Furthermore, the present invention will be described in terms of a particular semiconductor memory device. However, nothing prevents the method and system from being utilized with another semiconductor device.

It has been discovered that the unanticipated charge gain and charge loss is due to the CMP step used in removing the ARC layer. However, the ARC layer must not be present in the final semiconductor to allow for functions such as erasure using UV light. One method to remedy issues to the ARC layer would be to fabricate the conventional semiconductor device without the ARC layer. However, the ARC layer helps to reduce or eliminate large variations in the critical dimension of structures due to variations in the thickness of the photoresist used in fabricating the structures. Without the ARC layer, these variations may be unavoidable. Without the ARC layer, the conventional contacts may vary greatly in size, which is also undesirable. Thus, in order to address charge gain and charge loss issues while reducing variations in critical size of structures in the ILD due to variations in photoresist thickness, the present invention has been developed.

Figure 3:
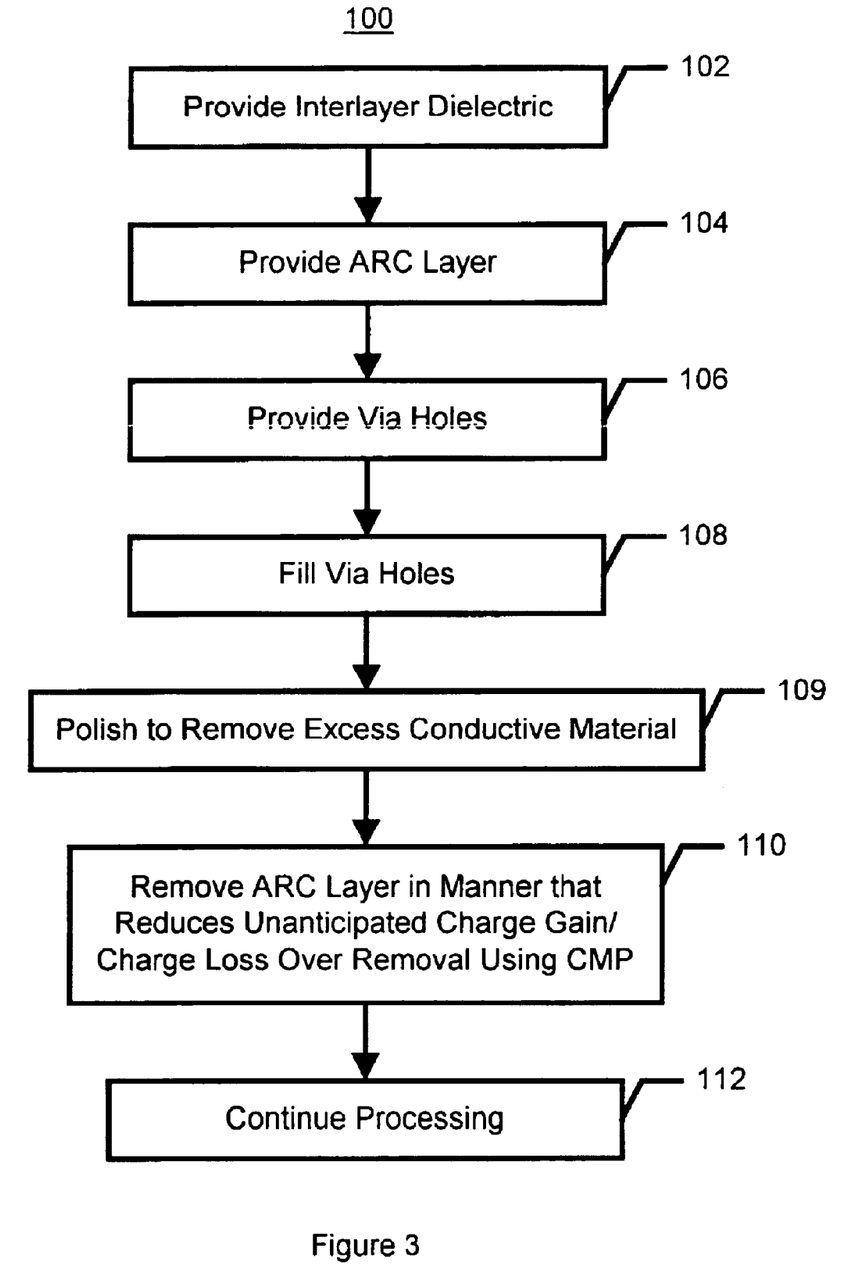
FIG. 3 is a flow chart depicting one embodiment of a method in accordance with the present invention for insulating a lower layer of a semiconductor device from the upper layer of the semiconductor device.

To more particularly illustrate the method and system in accordance with the present invention, refer now to FIG. 3, depicting one embodiment of a method 100 in accordance with the present invention for insulating one layer of the semiconductor device from another layer. The layers being insulated are described as a lower layer and an upper layer. Thus, the method 100 preferably commences after fabrication of the lower layer has been completed. An ILD is provided on the lower layer, via step 102. Generally, step 102 includes depositing an ILD such as BPTEOS or BPSG.

In a preferred embodiment, the ILD is deposited such that gaps in the lower layer are filled. This aids in ensuring that structures in the lower layer are properly insulated. For example, step 102 may include depositing a BPTEOS layer use chemical vapor deposition ("CVD") to ensure that spaces between the tops of memory cells in the lower layer are filled. An ARC layer is then provided, via step 104. Step 104 preferably includes depositing approximately two hundred to four hundred Angstroms of SiON onto the ILD. Deposition of the ARC layer aids in subsequent fabrication of contacts. Via holes are then provided in the ILD layer at the desired positions of contacts to the lower layer, via step 106. In a preferred embodiment, step 106 includes spinning a layer of photoresist onto the semiconductor device, developing a photoresist pattern, etching the ARC layer and ILD exposed by apertures in the photoresist pattern, and stripping the photoresist. The via holes are then filled with a conductive material, such as W, via step 108. In one embodiment, step 108 includes depositing a layer of conductive material. An excess portion of the conductive material that lies outside of the via holes is then removed, generally using a CMP step, via step 109. Thus, contacts to components in the lower layer are formed in the ILD. The ARC layer is then removed in a mannner that reduces or eliminates unanticipated charge gain and unanticipated charge loss, via step 110. In a preferred embodiment, step 110 includes using a plasma etch to remove the ARC layer. Preferably, the plasma etch utilizes a $CH_3F/O_2$ chemistry or a $CHF_3/O_2$ chemistry. However, nothing prevents the use of other removal mechanisms which also reduce charge gain and charge loss. Fabrication of the semiconductor device is then continued, via step 112.

Because the method 100 provides an ARC layer in step 104, the via holes and, therefore, contacts provided in the ILD have approximately the desired critical dimensions. Variations in the critical dimensions of the contacts due to variations in the photoresist thickness are thus reduced because of the ARC layer provided in step 106. Furthermore, the method 100 removes the ARC layer without a CMP step. Instead, a method, such as a plasma etch, is used. The method used results in reduced unexpected charge gain and unexpected charge loss. Consequently, performance of the device is improved.

Figure 4:
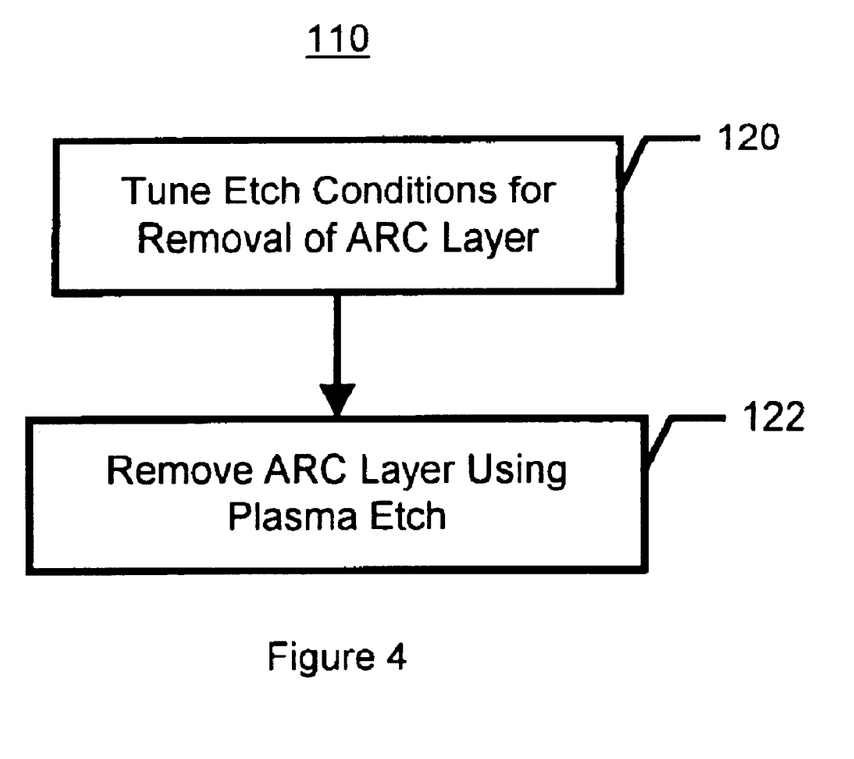
FIG. 4 is a more detailed flow chart depicting one embodiment of the step of removing the antireflective coating layer in accordance with the present invention.

FIG. 4 depicts a more detailed flow chart of a method for removing the ARC layer in step 110. The etch conditions are tuned to remove the ARC layer, via step 120. Step 120 thus may include selecting the appropriate gas species, pressure, and temperature in order to remove the ARC layer. In a preferred embodiment, step 120 includes selecting the $CH_3F/O_2$ chemistry or $CHF_3/O_2$ chemistry. The ARC layer is then plasma etched, via step 122. In a preferred embodiments, step 122 provides an oxide buff that removes the ARC layer. Because the plasma etch has been used in lieu of a CMP to remove the ARC layer, unexpected charge gain and loss are reduced. Performance of the semiconductor device is thus enhanced. Furthermore, the presence of the ARC layer during the formation of the via holes improves the control over the size of the via holes.

Figure 5A:
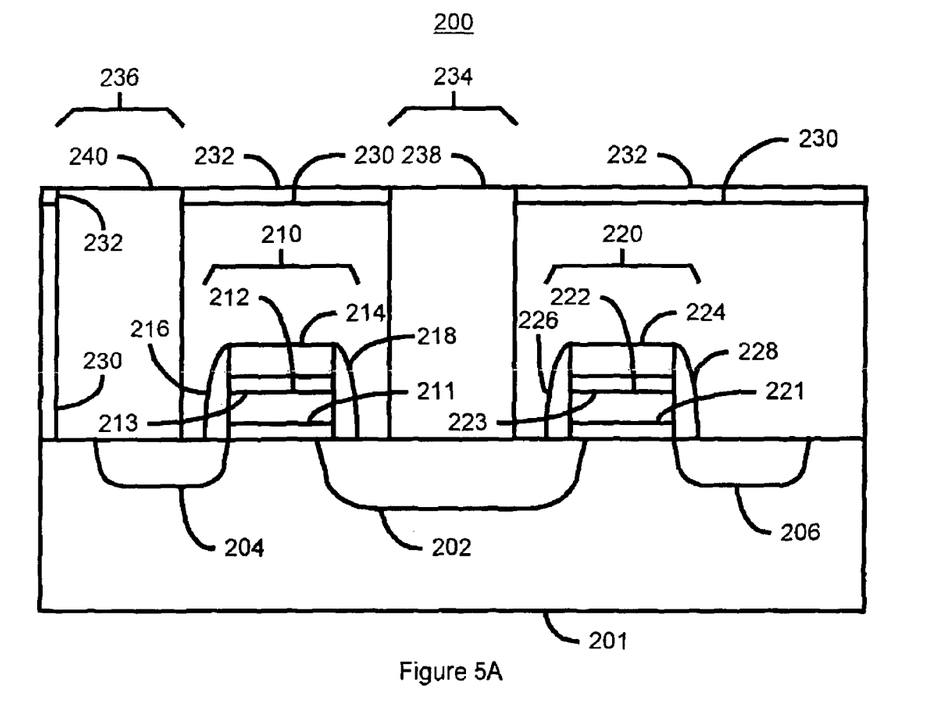
FIG. 5A is a side view of a conventional semiconductor device during fabrication, prior to removal of the antireflective coating layer.

FIG. 5A depicts a portion of a semiconductor device 200 in accordance with the present invention during fabrication. In particular, FIG. 5A depicts the semiconductor device 200 after step 108 has been performed for the first ILD. The semiconductor device 200 includes memory cells 210 and 220 which share a common drain 202. Sources 204 and 206 are also depicted. The memory cell 210 includes a floating gate 212 on a thin insulating layer 211, a control gate 214, and an insulating layer 213 separating the floating gate 212 from the control gate 214. The memory cell 210 also includes spacers 216 and 218. Similarly, the memory cell 220 includes a floating gate 222 on a thin insulating layer 221, a control gate 224, and an insulating layer 223 separating the floating gate 222 from the control gate 224. The memory cell 220 also includes spacers 226 and 228. The ILD 230 and the ARC layer 232 have also been deposited. The via holes 234 and 236 have been etched in the ILD 230. Furthermore, the via holes 234 and 236 have been filled with via a conductive material to form contacts 238 and 240. The ARC layer 232 is present during formation of the via holes 234 and 236. Thus, the variation in the widths of the via holes 234 and 236 due to variations in the thickness of the photoresist (not shown) used in fabricating the via holes 234 and 236 are reduced.

Figure 5B:
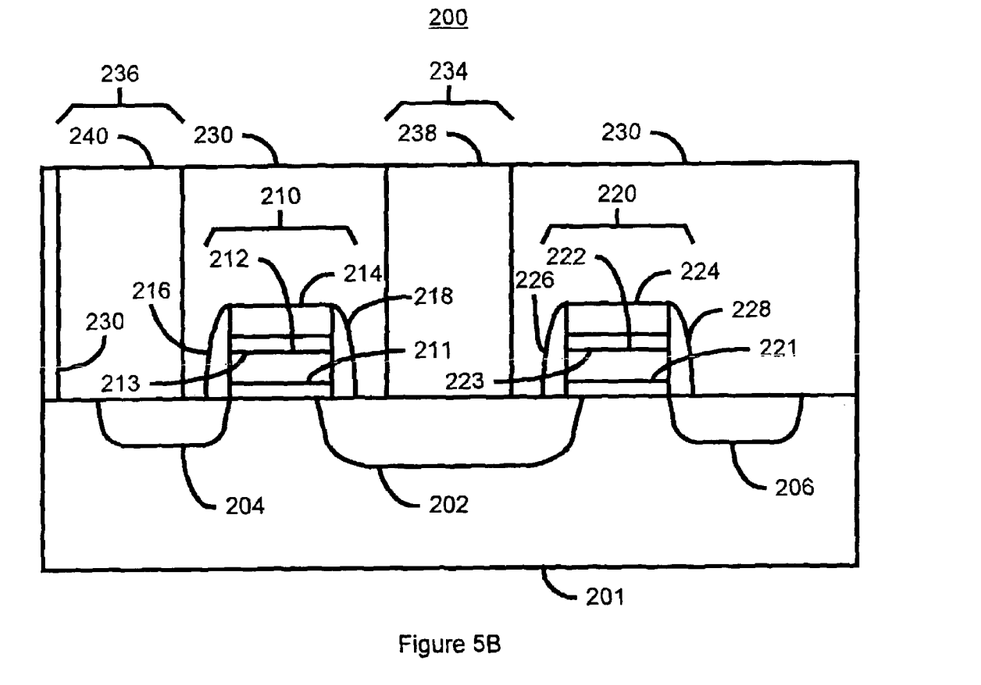
FIG. 5B is a side view of a conventional semiconductor device during fabrication, after removal of the antireflective coating layer.

FIG. 5B depicts the semiconductor device 200 after step 110 or 122, removal of the ARC layer 232. A second layer of components can be fabricated on the ILD 230. Because the ARC layer 232 has been removed, the memory cells 210 and 220 can be erased using UV light. Moreover, the CMP step was omitted in lieu of, for example, a plasma etch. Thus, the unanticipated charge gain or unanticipated charge loss are reduced beyond that achieved using conventional CMP for removing the ARC layer 232.

A method and system has been disclosed for providing an ILD with the use of an ARC layer and in which unanticipated charge gain and loss are reduced. Although the present invention has been described in accordance with the embodiments shown, one of ordinary skill in the art will readily recognize that there could be variations to the in embodiments and those variations would be within the spirit and scope of the present invention. Accordingly, many modifications may be made by one of ordinary skill in the art without departing from the spirit and scope of the appended claims.

What is claimed is:

1. A method for insulating a lower layer of a semiconductor device from an upper layer of the semiconductor device comprising the sequential steps of:

(a) providing an interlayer dielectric on the lower layer;

(b) providing an antireflective coating (ARC) layer, at least a portion of the ARC layer being on the interlayer dielectric;

(c) providing a plurality of via holes in the interlayer dielectric and the ARC layer;

(d) filling the plurality of via holes with a conductive material; and (e) removing the ARC layer while reducing subsequent undesirable charge gain and subsequent undesirable charge loss over the use of a chemical mechanical polish in removing the ARC layer.

2. The method of claim 1 wherein the ARC layer removing step (e) further includes the steps of:

(e1) removing the ARC layer using a plasma etch.

3. The method of claim 2 wherein the plasma etch further utilizes a $CH_3F/O_2$ chemistry or a $CHF_3/O_2$ chemistry.

4. The method of claim 1 wherein the conductive material used to fill the plurality of via holes is W.

5. The method of claim 1 wherein the interlayer dielectric is BPTEOS.

6. The method of claim 1 wherein the lower layer includes a plurality of memory cells and is a first layer fabricated on the semiconductor device.

7. The method of claim 1 further comprising the step of:

(f) providing a chemical mechanical polish of the conductive material.

* * * * *

UNITED STATES PATENT AND TRADEMARK OFFICE
CERTIFICATE OF CORRECTION

PATENT NO. : 6,727,143 B1
APPLICATION NO. : 09/533619
DATED : April 27, 2004
INVENTOR(S) : Angela T. Hui et al.

It is certified that error appears in the above-identified patent and that said Letters Patent is hereby corrected as shown below:

Column 1, Line 28, following "which" please delete "is".
Column 1, Line 51, following "ARC" please delete "so".
Column 3, Line 4, following "further" please delete "so".
Column 6, Line 29, following "to the" please delete "in".

Signed and Sealed this

Twenty-second Day of January, 2008

JON W. DUDAS
*Director of the United States Patent and Trademark Office*